(12) United States Patent
Su et al.

(10) Patent No.: US 8,536,056 B2
(45) Date of Patent: Sep. 17, 2013

(54) METHOD OF FORMING CONDUCTIVE PATTERN

(75) Inventors: Kuo-Hui Su, Taipei (TW); Yi-Nan Chen, Taipei (TW); Hsien-Wen Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 127 days.

(21) Appl. No.: 13/214,244

(22) Filed: Aug. 22, 2011

(65) Prior Publication Data
US 2013/0052820 A1    Feb. 28, 2013

(51) Int. Cl.
*H01L 21/28*    (2006.01)

(52) U.S. Cl.
USPC .......................................................... 438/670

(58) Field of Classification Search
CPC ....................................................... H01L 21/28
See application file for complete search history.

(56) References Cited

U.S. PATENT DOCUMENTS

| | | | | |
|---|---|---|---|---|
| 5,962,194 | A * | 10/1999 | Komatsu et al. | 430/312 |
| 7,153,775 | B2 * | 12/2006 | Geusic et al. | 438/687 |
| 2012/0156857 | A1 * | 6/2012 | Cohen et al. | 438/455 |

* cited by examiner

*Primary Examiner* — Walter H Swanson
(74) *Attorney, Agent, or Firm* — Jianq Chyun IP Office

(57) ABSTRACT

A method of forming conductive pattern is provided. A seeding layer is formed on an underlayer. By using an energy ray, an irradiation treatment is performed on a portion of a surface of the seeding layer. The seeding layer thus includes a plurality of irradiated regions and a plurality of unirradiated regions. A conversion treatment is performed on the irradiated regions of the seeding layer. A selective growth process is performed, so as to form a conductive pattern on each unirradiated region of the seeding layer. The irradiated regions of the seeding layer are removed, so that the conductive patterns are insulated from each other.

9 Claims, 6 Drawing Sheets

METHOD OF FORMING CONDUCTIVE PATTERN

BACKGROUND OF THE INVENTION

1. Field of the Invention

The invention relates to a semiconductor manufacturing process and more particularly to a method of forming a conductive pattern.

2. Description of Related Art

With the progressing of technology, the manufacture of electronic devices requires higher integrity to satisfy the market trend for electronic devices that are light, thin, short, and compact. Other than reducing the size of the semiconductor devices, the integrity of the electronic device can also be enhance by shortening the distance between the semiconductor devices. However, problems occur in the manufacturing process when the size of the semiconductor devices is reduced or the distance between the semiconductor devices is shortened.

Take the conductive patterns used for manufacturing the semiconductor devices as an example, in the conventional technique, an entire layer of conductive layer is first formed, a photoresist layer is formed on the conductive layer, and a photolithography process and an etching process are performed to the photoresist layer to form a patterned photoresist layer. Thereafter, the patterned photoresist layer is adopted as a mask to pattern the conductive layer so as to complete the manufacture of the conductive patterns. As the size of semiconductor devices becomes smaller, the size of conductive patterns also decreases relatively. Consequently, the aspect ratio of the conductive patterns becomes higher, thereby increasing the difficulty for manufacturing the conductive patterns. Moreover, complicated steps are required when forming the conductive patterns using the photolithography and etching processes, so that the manufacturing efficiency of the semiconductor devices cannot be enhanced easily.

SUMMARY OF THE INVENTION

The invention is directed to a method of forming a conductive pattern, the method having simplified manufacturing steps.

The invention is directed to a method of forming a conductive pattern. A seeding layer is formed on an underlayer. An irradiation treatment is performed to a portion of a surface of the seeding layer by using an energy ray, such that the seeding layer includes a plurality of irradiated regions and a plurality of unirradiated regions. A conversion treatment is performed to the irradiated regions of the seeding layer. A selective growth process is performed to form a conductive pattern on each of the unirradiated regions of the seeding layer. The irradiated regions of the seeding layer are removed, so that the conductive patterns are insulated from each other.

In one embodiment of the invention, a conductivity of the irradiated regions is lower than a conductivity of the unirradiated regions due to the conversion treatment.

In one embodiment of the invention, the seeding layer includes a metal layer or a doped layer.

In one embodiment of the invention, the seeding layer includes a tungsten layer, a titanium layer, or a silicon layer.

In one embodiment of the invention, a same material is adopted to form the seeding layer and the conductive pattern.

In one embodiment of the invention, different materials are adopted to form the seeding layer and the conductive pattern.

In one embodiment of the invention, the energy ray includes an E beam or a laser beam.

In one embodiment of the invention, the conversion treatment includes an insulation treatment.

In one embodiment of the invention, the conversion treatment includes an oxidation treatment or a nitridation treatment.

In one embodiment of the invention, the selective grow process includes a selective tungsten growth process or a selective silicon growth process.

In one embodiment of the invention, a method of removing the irradiated regions of the seeding layer includes an etch back process.

In light of the foregoing, in the method of forming the conductive pattern in the invention, an irradiation treatment and a conversion treatment are performed to a portion of a surface of a seeding layer to form a plurality of irradiated regions and a plurality of unirradiated regions. Afterwards, by utilizing the selectivity of the selective growth process on the irradiated regions and the unirradiated regions, a plurality of conductive patterns is formed on the unirradiated regions of the seeding layer. In other words, the irradiated regions and the unirradiated regions are defined by an energy ray in the invention, so that the conductive patterns are formed on the unirradiated regions and the irradiated regions correspond to the space among the conductive patterns. As a result, complicated photolithography steps are not required in the invention and the conductive patterns with the suitable sizes and configurations can be formed with simple manufacturing steps.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate embodiments and, together with the description, serve to explain the principles of the invention.

DESCRIPTION OF EMBODIMENTS

Figure 1A:
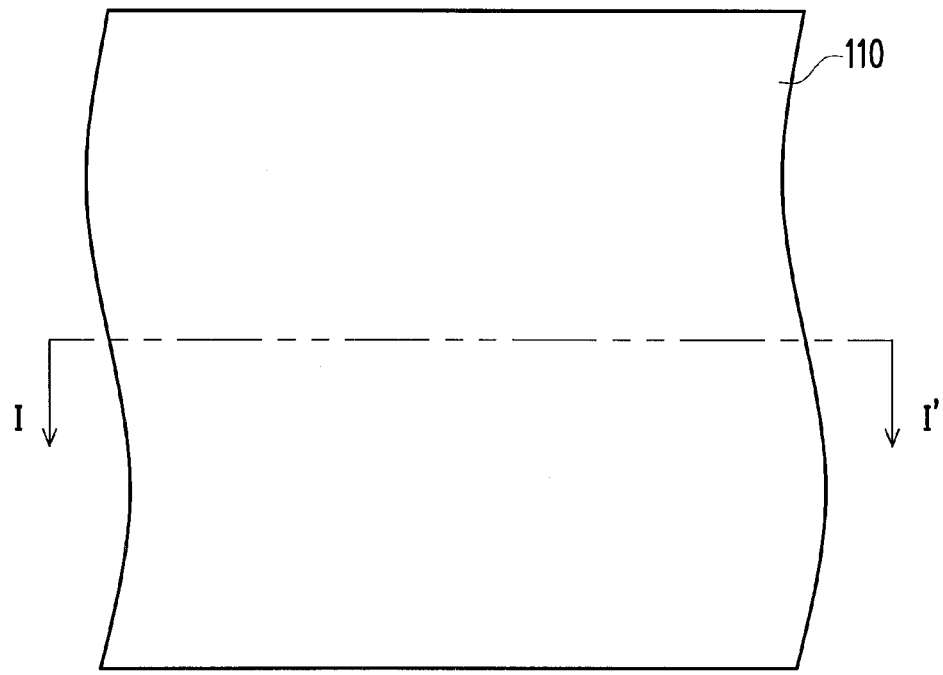
FIGS. 1A to 1E show top views of a schematic flowchart illustrating a method of forming a conductive pattern according to an embodiment of the invention.

FIGS. 1A to 1E show top views of a schematic flowchart illustrating a method of forming a conductive pattern according to an embodiment of the invention. FIGS. 2A to 2E are schematic cross-sectional diagrams taken along lines I-I' in FIGS. 1A to 1E. Referring to FIGS. 1A and 2A simultaneously, firstly, a seeding layer 110 is formed on an underlayer 100. In the present embodiment, the underlayer 100 is a substrate such as a silicon substrate, or an insulation layer, for example. The seeding layer 110 is, for instance, a conductive layer such as a silicon layer, a metal layer such as a tungsten layer or a titanium layer, or a doped layer such as a doped silicon layer. A method of forming the seeding layer 110 is physical vapor deposition (PVD), chemical vapor deposition (CVD) or atomic layer deposition (ALD), for example.

Figure 1B:
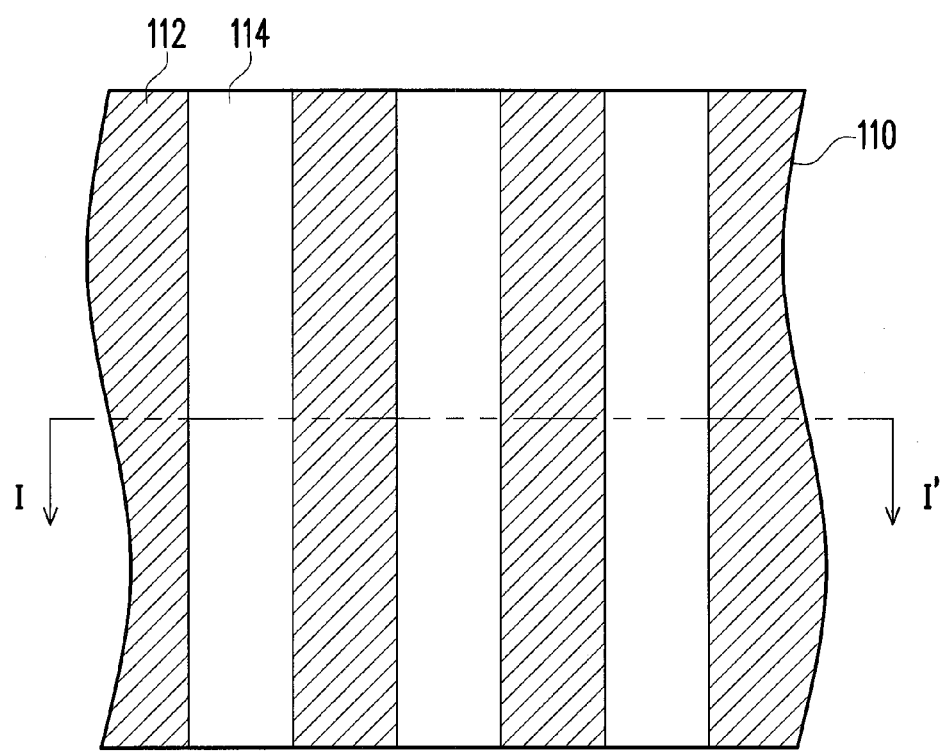
Figure 2A:
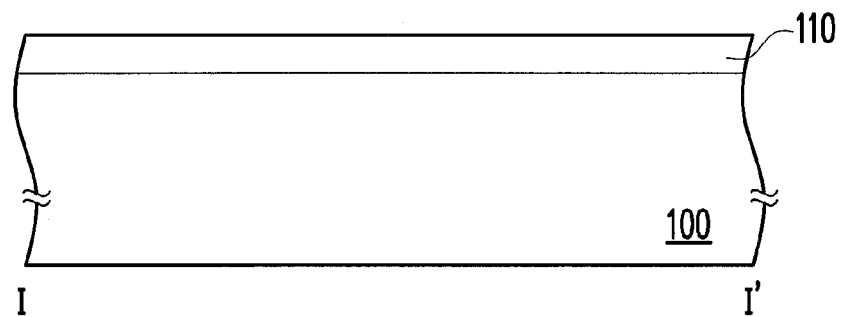
FIGS. 2A to 2E are schematic cross-sectional diagrams taken along lines I-I' in FIGS. 1A to 1E.
Figure 2B:
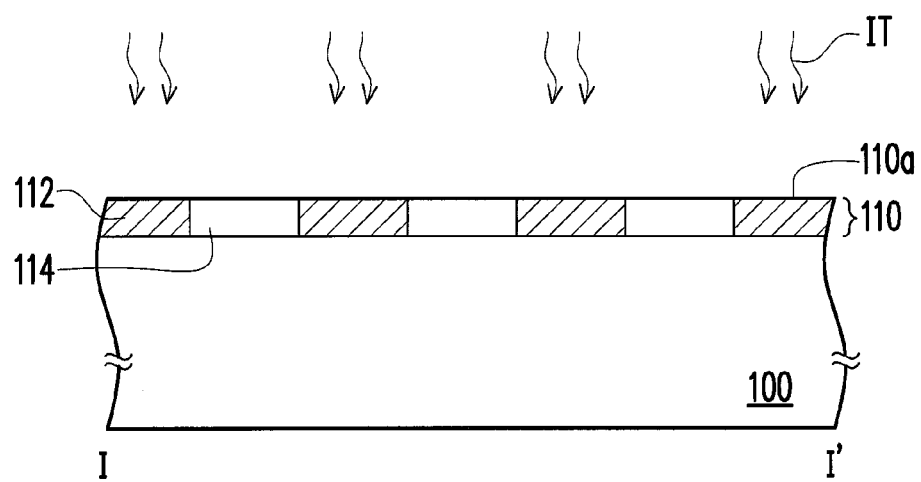

Referring to FIGS. 1B and 2B simultaneously, thereafter, an irradiation treatment IT is performed to a portion of a surface 110a of the seeding layer 110 using an energy ray. The seeding layer 110 therefore includes a plurality of irradiated regions 112 and a plurality of unirradiated regions 114. In the present embodiment, the energy ray is an E beam, a laser beam, or other suitable energy rays, for example. In details, a plurality of portions irradiated by the energy ray is the irradiated regions 112 and a plurality of portions not irradiated is the unirradiated regions 114. The irradiated regions 112 and the unirradiated regions 114 are arranged alternately, for instance, and the irradiated regions 112 and the unirradiated regions 114 are strip-shaped regions, for instance. In another embodiment, the irradiated regions 112 and the unirradiated regions 114 can also be arranged in an array, where the irradiated regions 112 and the unirradiated regions 114 are disposed alternately. In the present embodiment, a width of each of the irradiated regions 112 range is larger than 13.5 nm and depends on a wavelength of the energy ray, for example, and a width of each of the unirradiated regions 114 range is larger than 13.5 nm and depends on a wavelength of the energy ray, for example. The energy ray provides thermal energy to the irradiated regions 112, such that the irradiated regions 112 have higher temperature and thus higher reactivity. In the present embodiment, the irradiation treatment IT is carried out under oxygen-containing or nitrogen-containing environments, for example.

Figure 1C:
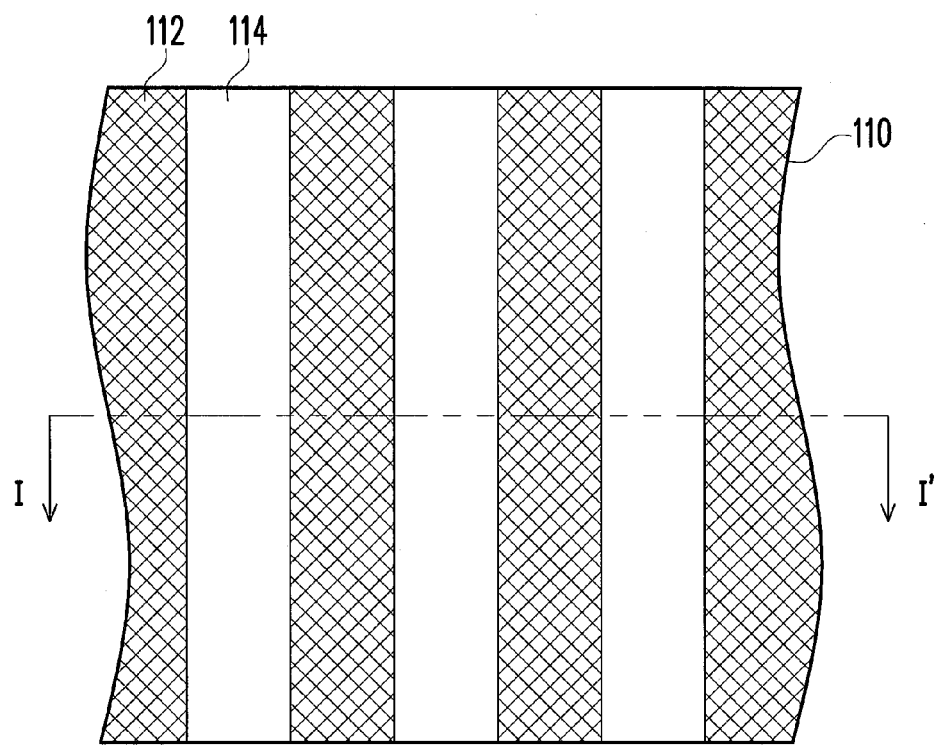
Figure 2C:
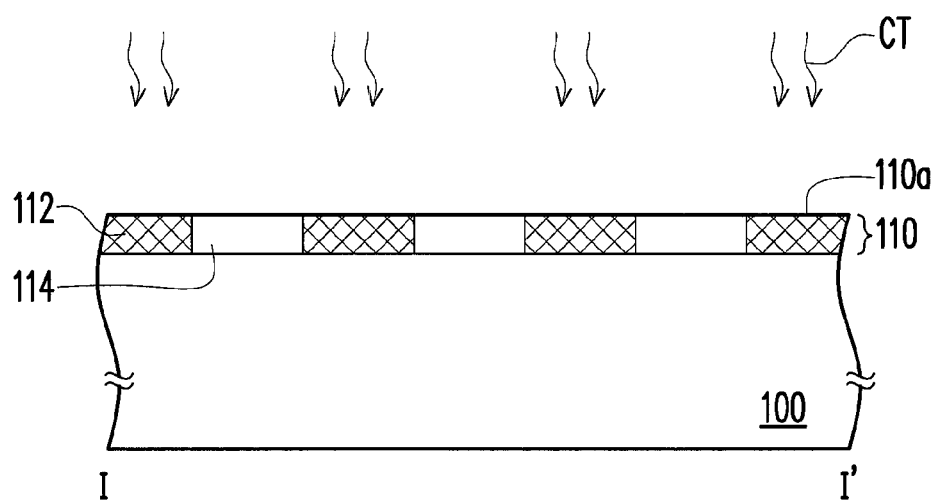

Referring to FIGS. 1C and 2C simultaneously, afterwards, a conversion treatment CT is performed to the irradiated regions 112 of the seeding layer 110. In the present embodiment, the conversion treatment CT includes an insulation treatment such as an oxidation treatment or a nitridation treatment. In the present embodiment, the conversion treatment CT is performed using a reactive gas such as nitrogen or oxygen, for example. In details, a reactive gas, such as oxygen, nitrogen, or the like, adopted to perform the conversion treatment CT is provided to the seeding layer 110 for contacting the seeding layer 110. Since the irradiated regions 112 have higher temperature and higher reactivity, the irradiated regions 112 react with the reactive gas and are converted from a metal to a metal oxide or a metal nitride. As a consequence, the irradiated regions 112 are converted from metals with higher conductivity to metal oxides with lower conductivity. In other words, the conductivity of the irradiated regions 112 is decreased after the conversion treatment CT. The irradiated regions 112 then change from conductive to insulative. On the other hand, the unirradiated regions 114 rarely react with the reactive gases and therefore maintain the conductivity of the seeding layer 110. In other words, in the present embodiment, the conductivity of the irradiated regions 112 is lower than the conductivity of the unirradiated regions 114 after the conversion treatment CT, for example. Taken the seeding layer 110 including a tungsten layer as an example, after the conversion treatment CT, the irradiated regions 112 are converted into tungsten oxide or tungsten nitride regions, for example, and the unirradiated regions 114 remain as tungsten regions. Therefore, the unirradiated regions 114 have metal properties and the irradiated regions 112 have non-metal properties.

It should be noted that the irradiation of an energy ray is generally performed to the seeding layer 110 in oxygen-containing or nitrogen-containing environments. As a consequence, the irradiation treatment IT and the conversion treatment CT can be simultaneously performed substantially. In other words, when the irradiation treatment IT is performed to the seeding layer 110 using the energy ray to form the irradiated regions 112, the conversion treatment CT can be performed to the irradiated regions 112 simultaneously with the reactive gas accompanying the energy ray. The irradiated regions 112 and the unirradiated regions 114 therefore have different properties such as different conductivities. Obviously, in other embodiments, the irradiation treatment IT and the conversion treatment CT can be performed respectively.

That is, the irradiation treatment IT is first performed and the conversion treatment CT is then performed.

Notably, although the irradiated regions 112 and the unirradiated regions 114 have different conductivities due to the irradiation treatment IT and the conversion treatment CT in the present embodiment, the invention is not limited thereto. In other words, the conversion treatment CT only needs to provide the irradiated regions 112 and the unirradiated regions 114 with grow selectivity in a selective growth process SGP subsequently performed and described below. For instance, in another embodiment, the seeding layer 110 includes a silicon oxide layer. After a conversion treatment CT passed with ammonia is performed, the irradiated regions 112 are converted into silicon nitride regions, for example, and the unirradiated regions 114 remain as silicon oxide regions. It should be illustrated that when the underlayer 100 is a silicon oxide substrate, a formation of the seeding layer 110 can be omitted. In other words, an upper portion of the underlayer 100 can be applied as the seeding layer 110 directly. The upper portion of the underlayer 100 is then performed with the irradiation treatment IT and the conversion treatment CT to form the irradiated regions 112 and the unirradiated regions 114.

Figure 1D:
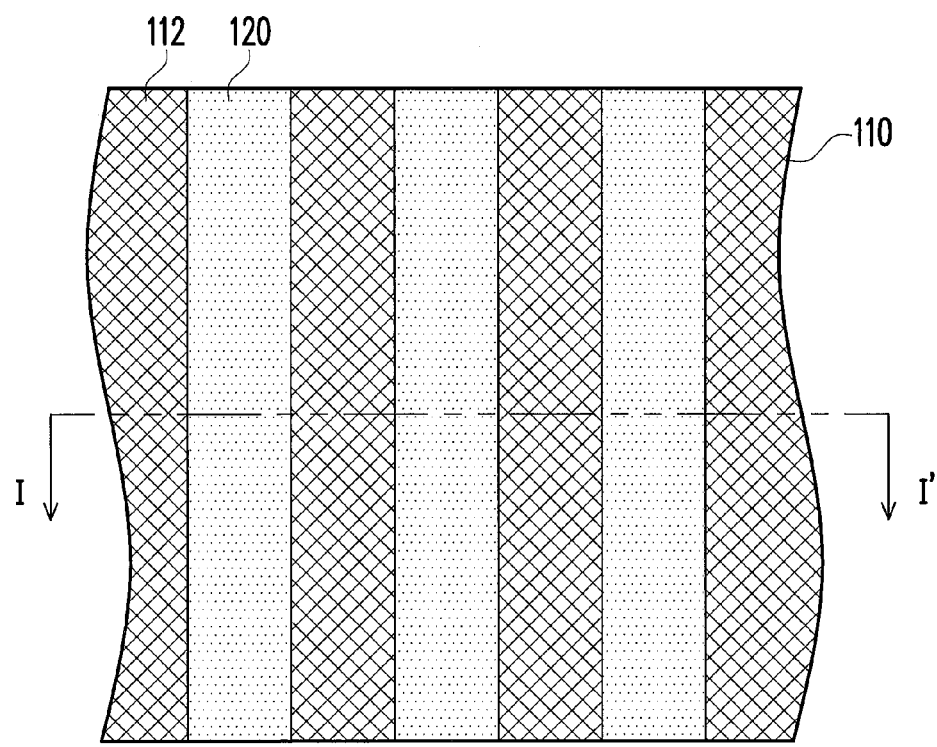
Figure 2D:
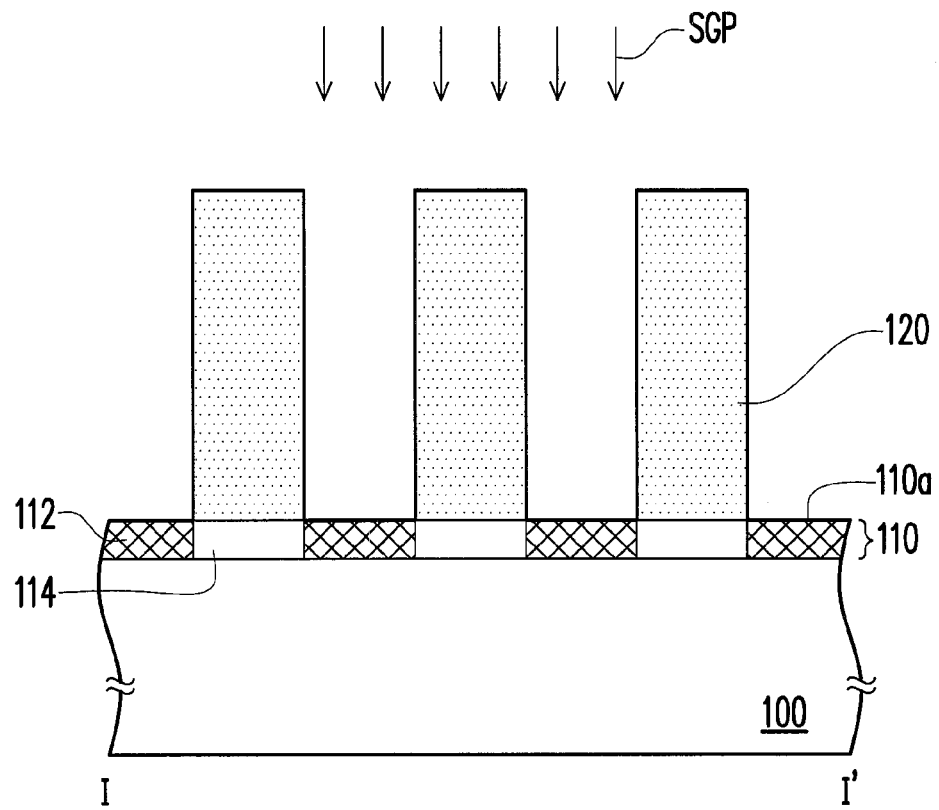

Referring to FIGS. 1D and 2D simultaneously, the selective growth process SGP is performed to form a conductive pattern 120 on each of the unirradiated regions 114 of the seeding layer 110. In the present embodiment, the selective grow process SGP is, for example, a selective tungsten growth process or a selective silicon growth process. Herein, the selectivity of the selective growth process SGP to the irradiated regions 112 and the unirradiated regions 114 is controlled by adjusting the flow of each of the reactive gases in the selective growth process SGP. For instance, when the irradiated regions 112 include tungsten oxide regions or tungsten nitride regions, the unirradiated regions 114 include tungsten regions, and the selective growth process SGP is the selective tungsten growth process, the flow among tungsten hexafluoride ($WF_6$), silicon methane ($SiH_4$), and hydrogen gas $H_2$ that are used to form a tungsten layer is adjusted, so that the tungsten layer is merely formed on the unirradiated regions 114 selectively. Therefore, the conductive patterns 120 are merely formed on the surfaces of the unirradiated regions 114 and the irradiated regions 112 define the space among the conductive patterns 120. In the present embodiment, the conductive patterns 120 are conductive wires, for instance. A material of the seeding layer 110 is the same as a material of the conductive patterns 120. In other words, the seeding layer 110 is a tungsten layer, for example, and the conductive patterns 120 are, for example, tungsten wires formed by the selective tungsten growth process. In another embodiment, the seeding layer 110 is, for instance, a silicon layer and the conductive patterns 120 are silicon wires formed by the selective silicon growth process, for example. Obviously, in other embodiments, the material of the seeding layer 110 can also be different from the material of the conductive patterns 120.

Figure 1E:
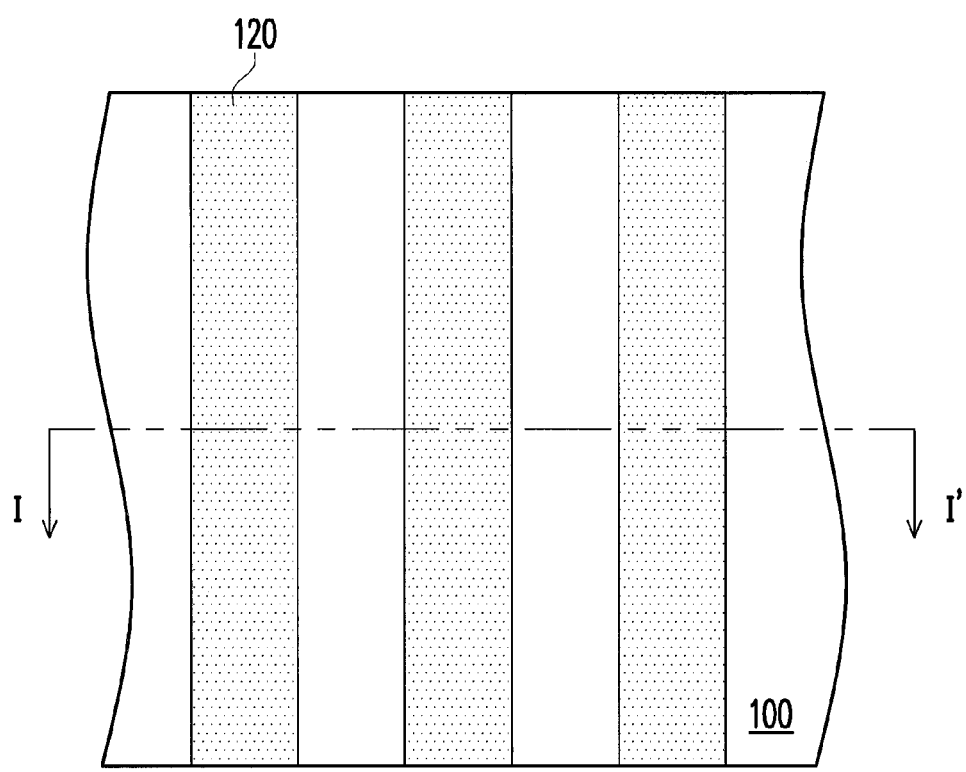
Figure 2E:
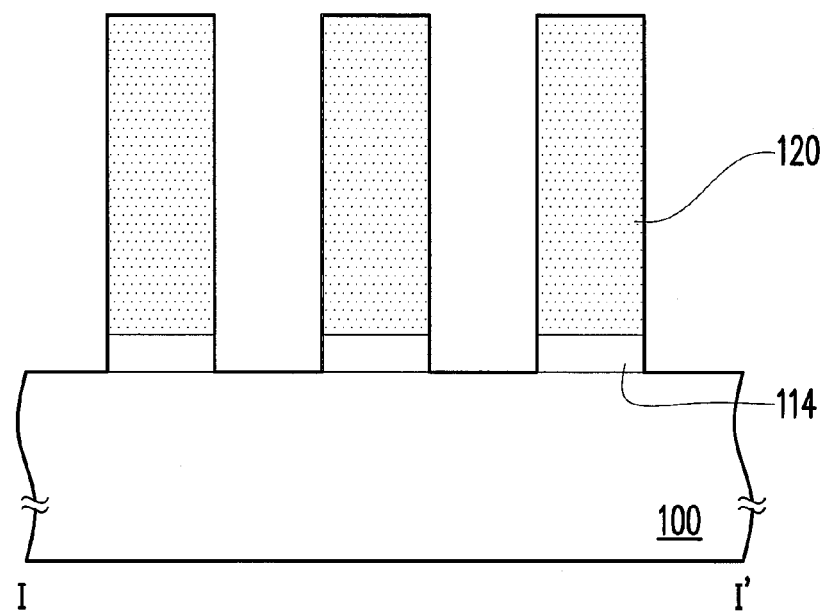

Referring to FIGS. 1E and 2E, next, the irradiated regions 112 of the seeding layer 110 are removed so that the conductive patterns 120 are insulated from each other. In the present embodiment, the irradiated regions 112 of the seeding layer 110 are removed by an etch back process, for example.

In the present embodiment, the irradiation treatment IT and the conversion treatment CT are performed to a portion of the surface 110a of the seeding layer 110 to form the irradiated regions 112 and the unirradiated regions 114. Afterwards, the conductive patterns 120 are formed on the unirradiated regions 114 of the seeding layer 110 by utilizing the selectivity of the selective growth process SGP to the irradiated regions 112 and the unirradiated regions 114. In other words, the locations and sizes of the irradiated regions 112 and the unirradiated regions 114 are defined using the energy ray in the present embodiment. Afterwards, the conductive patterns 120 are formed on the unirradiated regions 114 by the selective growth process SGP, so that the unirradiated regions 114 correspond to the conductive patterns 120 and the irradiated regions 112 correspond to the space among the conductive patterns 120. Accordingly, the conductive patterns of the present embodiment are formed by cooperatively using the seeding layer, the irradiation treatment, the conversion treatment, and the selective growth process, where the photolithography process and the etching process are not required. In other words, complicated steps such as manufacturing photomasks and performing exposure and development can be prevented, and the conductive patterns with the suitable sizes and configurations can be formed with simple manufacturing steps. Therefore, the method of forming the conductive patterns in the present embodiment can increase the manufacturing efficiency of the semiconductor devices and reduce the manufacturing cost of the semiconductor devices.

In summary, in the method of forming the conductive patterns in the invention, the irradiation treatment and the conversion treatment are performed to a portion of the surface of the seeding layer to form the irradiated regions and the unirradiated regions. Afterwards, the conductive patterns are formed on the unirradiated regions of the seeding layer by utilizing the selectivity of the selective growth process to the irradiated regions and the unirradiated regions. In other words, the locations and sizes of the irradiated regions and the unirradiated regions are defined by the energy ray in the invention, and then processed with the irradiation treatment and the conversion treatment, so that the conductive patterns are formed on the unirradiated regions by the selective growth process and the irradiated regions correspond to the space among the conductive patterns. As a consequence, complicated photolithography and etching processes are not required in the invention and the conductive patterns with the suitable sizes and configurations can be formed with simple manufacturing steps.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A method of forming a conductive pattern, the method comprising:
    forming a seeding layer on an underlayer;
    performing an irradiation treatment to a portion of a surface of the seeding layer by using an energy ray, such that the seeding layer comprises a plurality of irradiated regions and a plurality of unirradiated regions;
    performing a conversion treatment to the irradiated regions of the seeding layer;
    performing a selective growth process to form a conductive pattern on each of the unirradiated regions of the seeding layer, wherein a same material is adopted to form the seeding layer and the conductive pattern; and
    removing the irradiated regions of the seeding layer, so that the conductive patterns are insulated from each other.

2. The method of forming the conductive pattern as claimed in claim 1, wherein a conductivity of the irradiated regions is lower than a conductivity of the unirradiated regions due to the conversion treatment.

3. The method of forming the conductive pattern as claimed in claim 1, wherein the seeding layer comprises a metal layer or a doped layer.

4. The method of forming the conductive pattern as claimed in claim 1, wherein the seeding layer comprises a tungsten layer, a titanium layer, or a silicon layer.

5. The method of forming the conductive pattern as claimed in claim 1, wherein the energy ray comprises an E beam or a laser beam.

6. The method of forming the conductive pattern as claimed in claim 1, wherein the conversion treatment comprises an insulation treatment.

7. The method of forming the conductive pattern as claimed in claim 1, wherein the conversion treatment comprises an oxidation treatment or a nitridation treatment.

8. The method of forming the conductive pattern as claimed in claim 1, wherein the selective grow process comprises a selective tungsten growth process or a selective silicon growth process.

9. The method of forming the conductive pattern as claimed in claim 1, wherein a method of removing the irradiated regions of the seeding layer comprises an etching back process.

* * * * *